United States Patent
Koopmans

(10) Patent No.: US 9,881,910 B2
(45) Date of Patent: *Jan. 30, 2018

(54) APPARATUSES AND METHODS FOR FORMING DIE STACKS

(71) Applicant: MICRON TECHNOLOGY, INC., Boise, ID (US)

(72) Inventor: Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,660

(22) Filed: Apr. 18, 2017

(65) Prior Publication Data

US 2017/0221873 A1    Aug. 3, 2017

Related U.S. Application Data

(63) Continuation of application No. 14/967,009, filed on Dec. 11, 2015, now Pat. No. 9,659,917.

(51) Int. Cl.
| | |
|---|---|
| H01L 21/68 | (2006.01) |
| H01L 21/78 | (2006.01) |
| H01L 25/00 | (2006.01) |
| H01L 25/18 | (2006.01) |
| H01L 21/683 | (2006.01) |
| H01L 23/00 | (2006.01) |

(52) U.S. Cl.
CPC .......... *H01L 25/50* (2013.01); *H01L 21/6835* (2013.01); *H01L 24/80* (2013.01); *H01L 24/97* (2013.01); *H01L 25/18* (2013.01); *H01L 21/78* (2013.01); *H01L 2221/68354* (2013.01); *H01L 2221/68395* (2013.01); *H01L 2224/80006* (2013.01); *H01L 2224/80203* (2013.01); *H01L 2224/95001* (2013.01)

(58) Field of Classification Search
CPC ......... H01L 25/50; H01L 24/80; H01L 24/97; H01L 21/6835; H01L 25/18; H01L 2224/80203; H01L 2224/80006; H01L 2224/95001; H01L 2221/68395; H01L 2221/68354; H01L 22/14; H01L 21/78
USPC .......................................................... 438/15
See application file for complete search history.

(56) References Cited

U.S. PATENT DOCUMENTS

| | | |
|---|---|---|
| 7,101,620 B1 | 9/2006 | Poddar et al. |
| 9,659,917 B1 | 5/2017 | Koopmas |
| 2008/0226884 A1 | 9/2008 | Sim et al. |
| 2012/0234497 A1 | 9/2012 | Han et al. |
| 2013/0026643 A1 | 1/2013 | England et al. |
| 2017/0170158 A1 | 6/2017 | Koopmans |

OTHER PUBLICATIONS

U.S. Appl. No. 14/967,009, entitled "Apparatus and Methods for Forming Die Stacks", filed Dec. 11, 2015, pp. all.

*Primary Examiner* — Caleen Sullivan
(74) *Attorney, Agent, or Firm* — Dorsey & Whitney LLP

(57) ABSTRACT

Apparatuses and methods for forming die stacks are disclosed herein. An example method includes dispensing a temporary adhesive onto a substrate, placing a base die onto the temporary adhesive, curing the temporary adhesive, forming a die stack that includes the base die, activating a release layer disposed on the substrate, wherein the release layer is between the substrate and the temporary adhesive, removing the die stack from the substrate, and removing the temporary adhesive from the die stack.

20 Claims, 11 Drawing Sheets

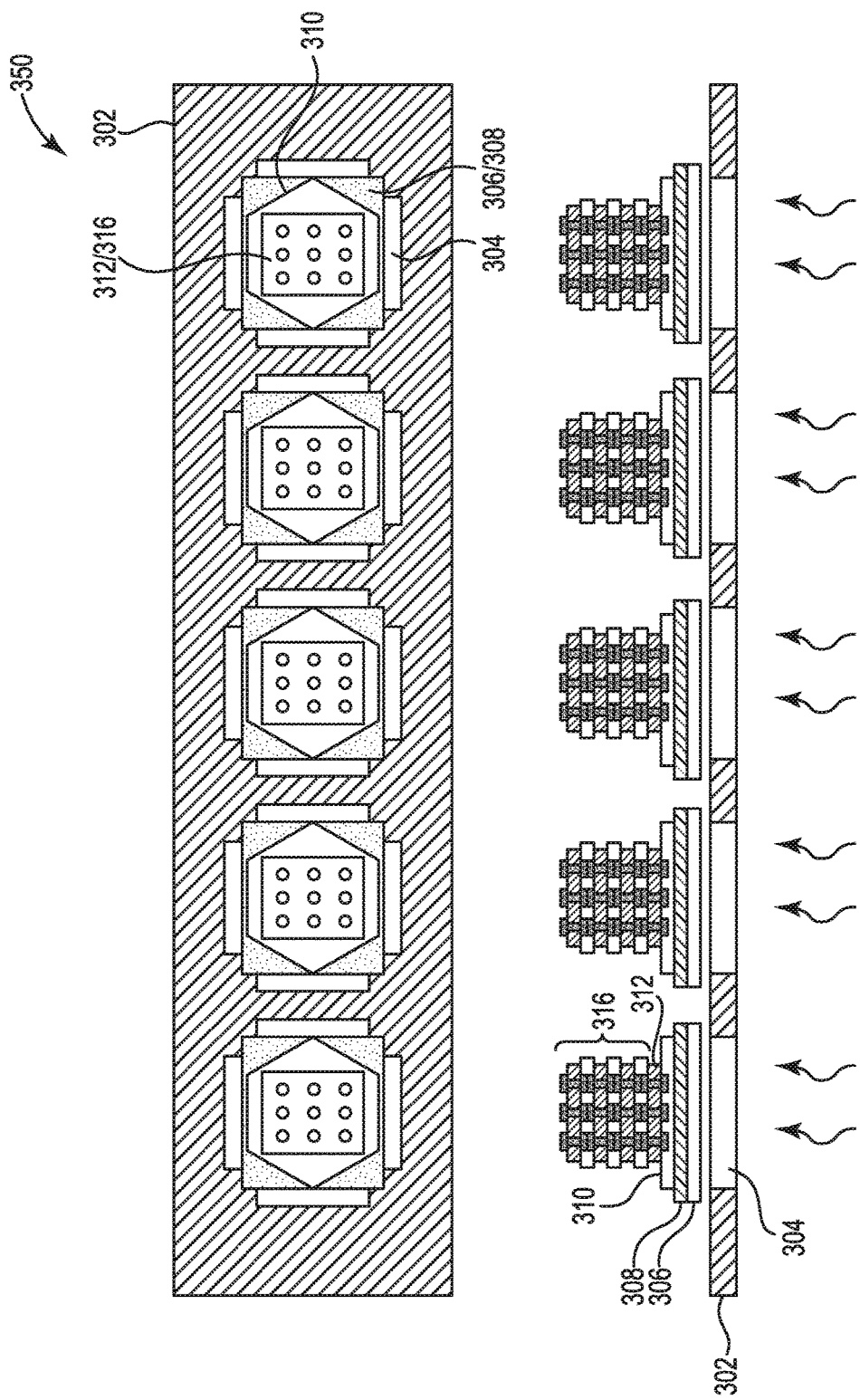

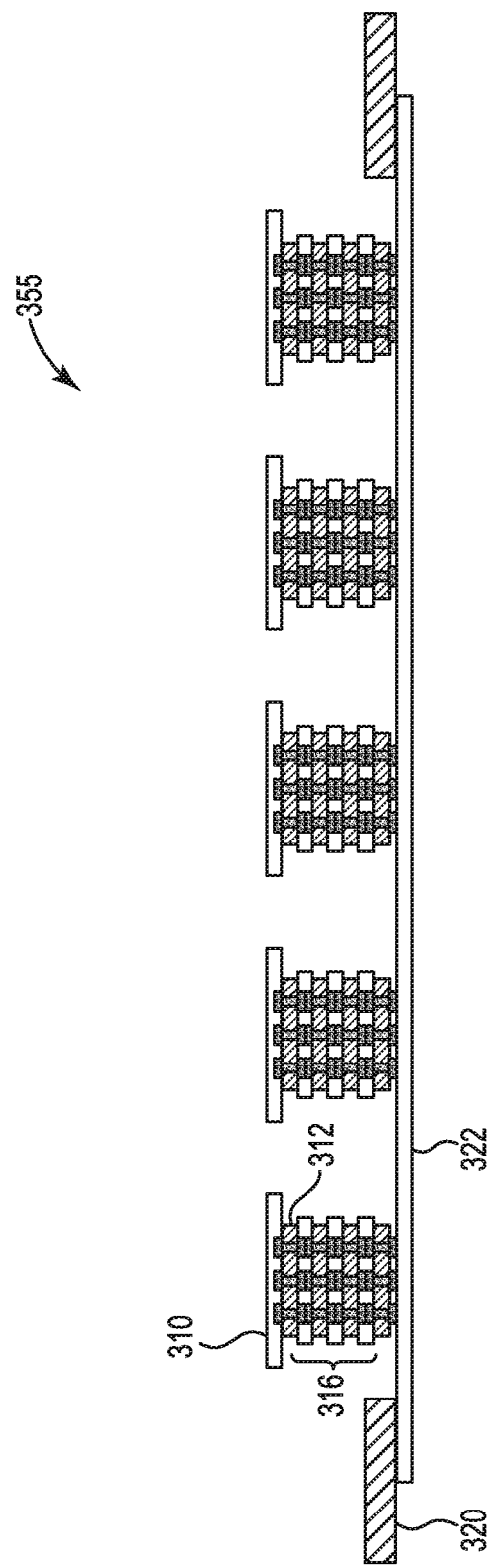

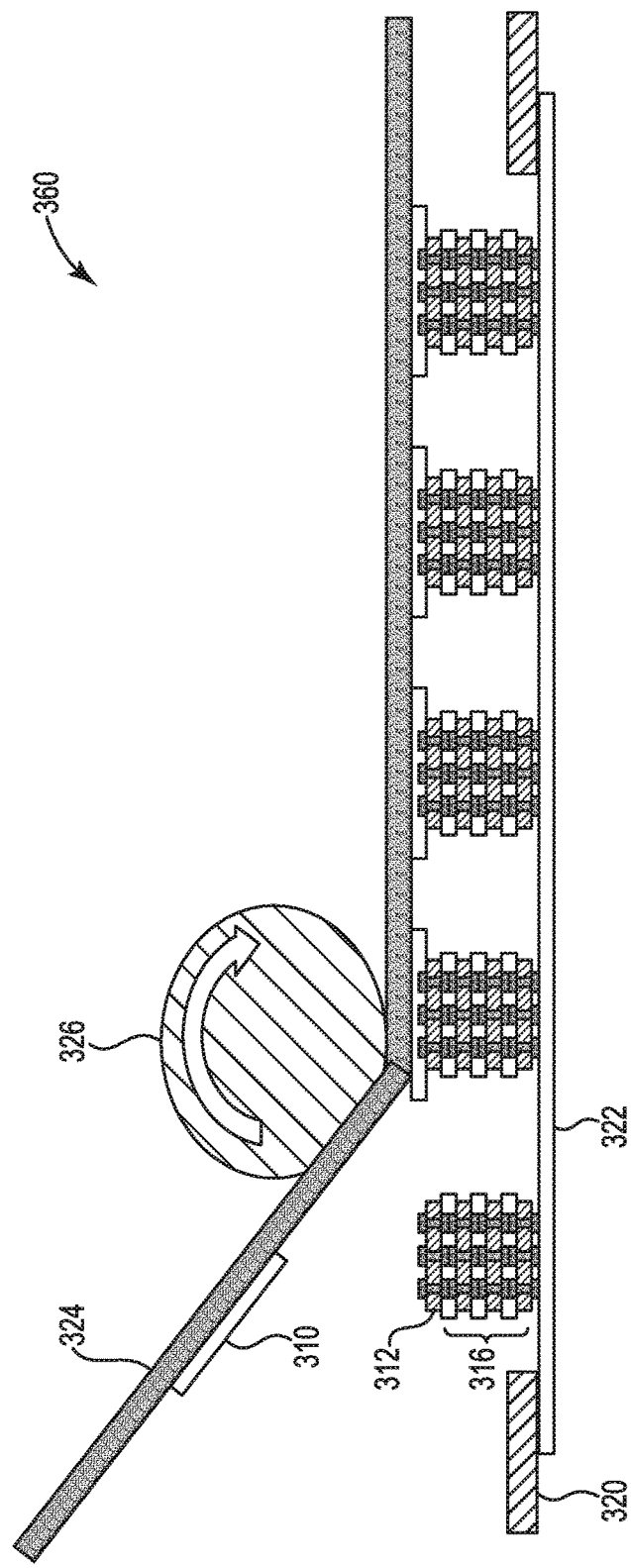

APPARATUSES AND METHODS FOR
FORMING DIE STACKS

CROSS REFERENCE TO RELATED APPLICATIONS

This application is a continuation of U.S. patent application Ser. No. 14/967,009 filed Dec. 11, 2015 and issued as U.S. Pat. No. 9,659,917 on May 23, 2017. The aforementioned application and issued patent are incorporated herein by reference, in their entirety, for any purpose.

BACKGROUND

Semiconductor manufacturers are moving toward packages that include multiple die. In some instances, the multiple die may be packaged as an interconnected die stack. Conventionally, forming the die stack may be at least partially performed at the wafer level. Wafer level processing of die stacks may include at least one die that is still part of a yet-to-be diced wafer. For example, a wafer of die may have die stacked onto the wafer during a die stacking process in order to form die stacks. Such wafer level processes, however, may have associated high costs and high risks. The high costs may be due to the need for new tooling to handle the wafers, and the scrap that may result from processing bad die. High risk may be due to the handling of fully processed wafers that have had additional die bonded thereto, which may increase the cost associated with each process step. Mishandling a partially processed wafer may result in costly breakage. Developing tools to handle the wafers that included additional die bonded thereto may add to the cost and handling difficulties of such wafer level processes.

BRIEF DESCRIPTION OF THE DRAWINGS

FIGS. 3A-3H are illustrations of a process steps in accordance with an embodiment of the present disclosure.

DETAILED DESCRIPTION

Apparatuses and methods for forming die stacks are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As noted, a conventional approach to forming die stacks may be to form the die stacks on a base wafer. Subsequent to the die stack formation the base wafer may be separated to provide individual die stacks. This wafer-level die stacking process, however, may have various costs and risks. For example, handling fully processed wafers that also have multiple die stacked on each die of the wafer may require the development of new backend manufacturing tools. Further, a wafer of thousands of die that also include thousands of more die stacked thereon would be a costly wafer to mishandle and break. As such, it may be desirable to have a die stacking process that reduces the associated costs and risks with respect to the wafer level processes.

One solution may be to process die into die stacks at the die level using a die-level die stacking process rather than a wafer-level die stacking process. Such a die stacking process may occur after all die have been diced. Each die may have already been tested so that only known good die are processed through the die level processing. The die level processing may use die-level tooling configured for existing manufacturing tools. For example, a process carrier may be configured to hold a plurality of individual process substrates, which may be configured to be handled by existing backend manufacturing tools. The individual process substrates may be used as a temporary base for the formation of the die stacks, which may be formed using processes that are performed in batches and/or on a per die stack basis. The die stacking process may include multiple temporary components that affix the die stacks to the process substrates during die stack formation. The temporary components may then be removed once the die stacks have been formed. The die stacks may then be removed from the process substrates upon formation of the die stacks.

Figure 1:
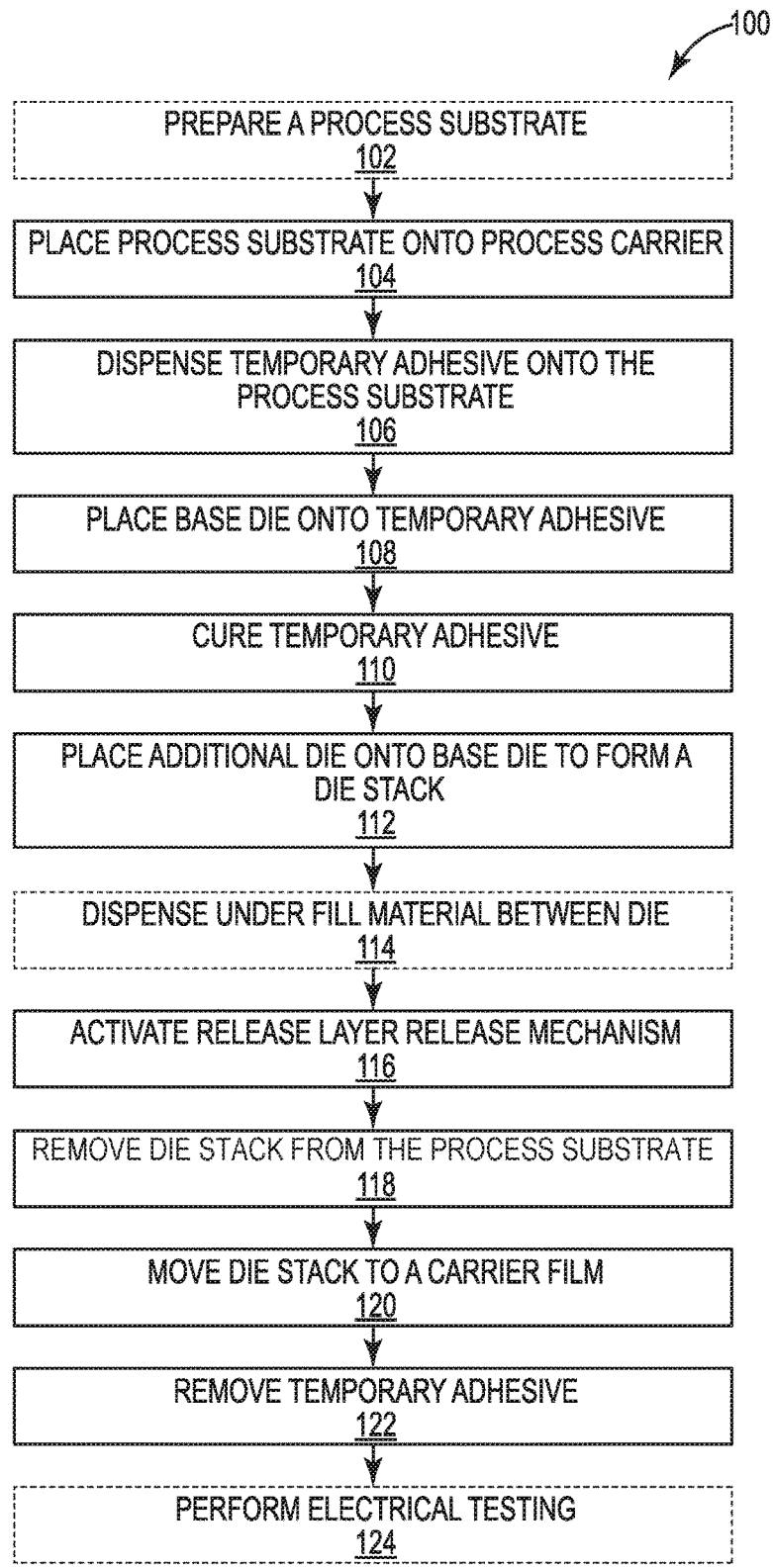
FIG. 1 is an example flow diagram of a process according to an embodiment of the present disclosure.

FIG. 1 is an example flow diagram of a process 100 according to an embodiment of the present disclosure. The process 100 may be used as a die stacking process. In some embodiments, the process 100 may be used to form an electrically interconnected die stack. As used herein, a die stack may comprise two or more die formed into a die stack that is at least mechanically connected to form a unitary component. In some embodiments, a die stack may have one or more materials located between adjacent surfaces, such as metallic bonds, fill materials, etc., to provide electrical coupling between the die in a die stack and/or structural support to the die stack. The process 100 may be further illustrated in FIGS. 2, 3A-3H, and 4, which will be discussed in more detail below. The process steps shown in FIG. 1 are an example process flow and are non-limiting. Additionally, the process steps may be performed in a different order and/or additional and/or fewer steps may be included. Further, two or more of the process steps shown in FIG. 1 may be combined into a single step. For example, steps 106 and 108 may be iteratively performed so that the curing of the temporary adhesive is performed nearly contemporaneously with the placement of the base die. Other steps may be combined as well. Additionally, the steps outlined by dashed lines may be omitted in some embodiments.

Figure 2:
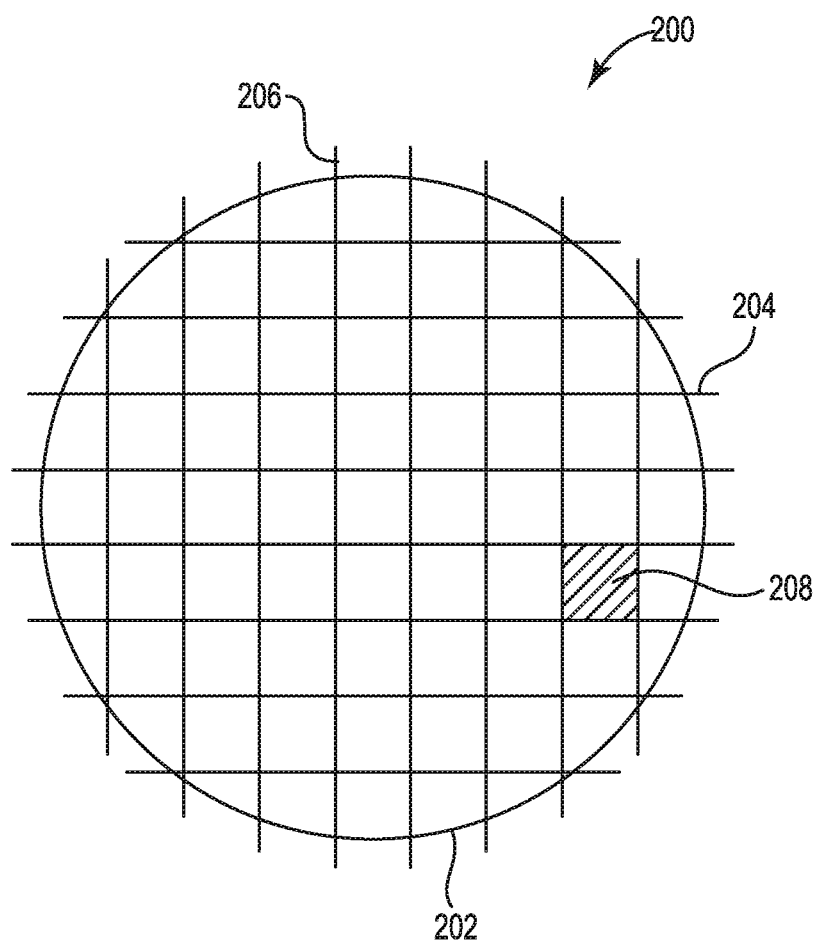
FIG. 2 is an example diagram of a dicing pattern in accordance with an embodiment of the present disclosure.

The process 100 may begin with step 102. Step 102 may include preparing a process substrate. The process substrate may be a temporary substrate for supporting the formation of a die stack during the process 100. Preparing a process substrate may include dicing, e.g., cutting, a material into a desired shape of a desired size. FIG. 2 shows an example of dicing a material into a plurality of process substrates. In some embodiments, the process substrate may be transparent to one or more wavelengths of electro-magnetic (EM) radiation. In some embodiments, the process substrate may be formed of glass and may be transparent to wavelengths ranging from deep infrared to ultraviolet. The process substrate may further include a release layer formed on at least one side. The release layer may be used to separate the process substrate and a formed die stack after completion of the process 100.

The process substrate may be used as a temporary base for processing one or more semiconductor die. For example, the process substrate may be used to process a plurality of die into a die stack. Subsequent to the formation of the die stack, the process substrate may be removed, as will be discussed in more detail below, to allow the die stack to be used without the process substrate attached. The step 102 may be optional. In some embodiments, the process substrates may be provided in a desired size and shape and include the release layer.

Figure 3A:
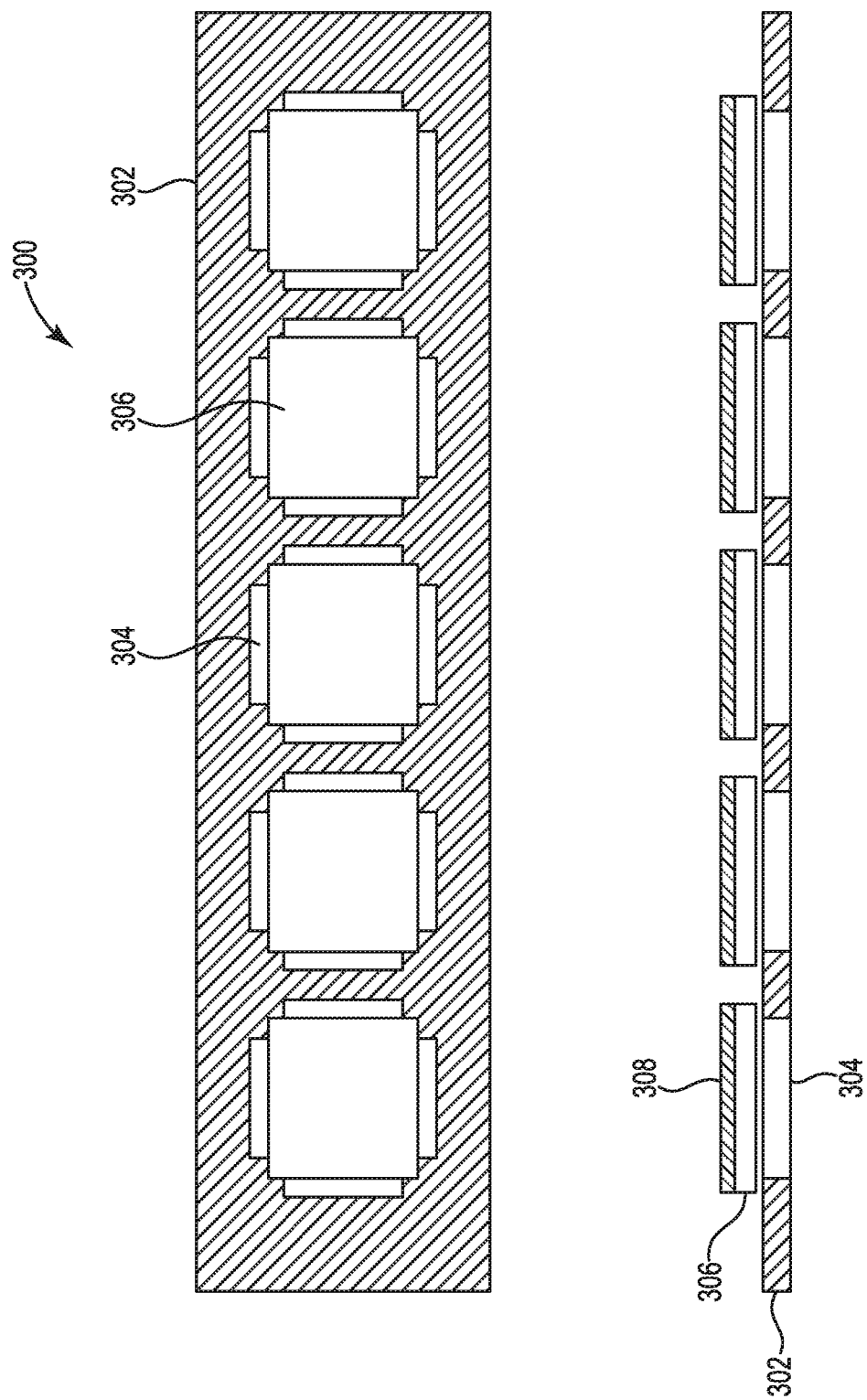

Step 104 may include placing the process substrate onto a process carrier. FIG. 3A shows an example process carrier and an example placement of process substrates on a process carrier. The process carrier may be formed to hold one or more process substrates. The process carrier may have one or more openings formed therein. The openings may include edge support for holding a process substrate so that at least a portion of the process substrate is located over an opening. As such, the openings may allow access to a bottom side of the process substrates, which may be used in one or more steps of the process 100. The process substrates may be loaded onto the process carrier, and placed over a corresponding opening using any known loading method, such as by a pick and place tool or manually loading by an operator.

Figure 3B:
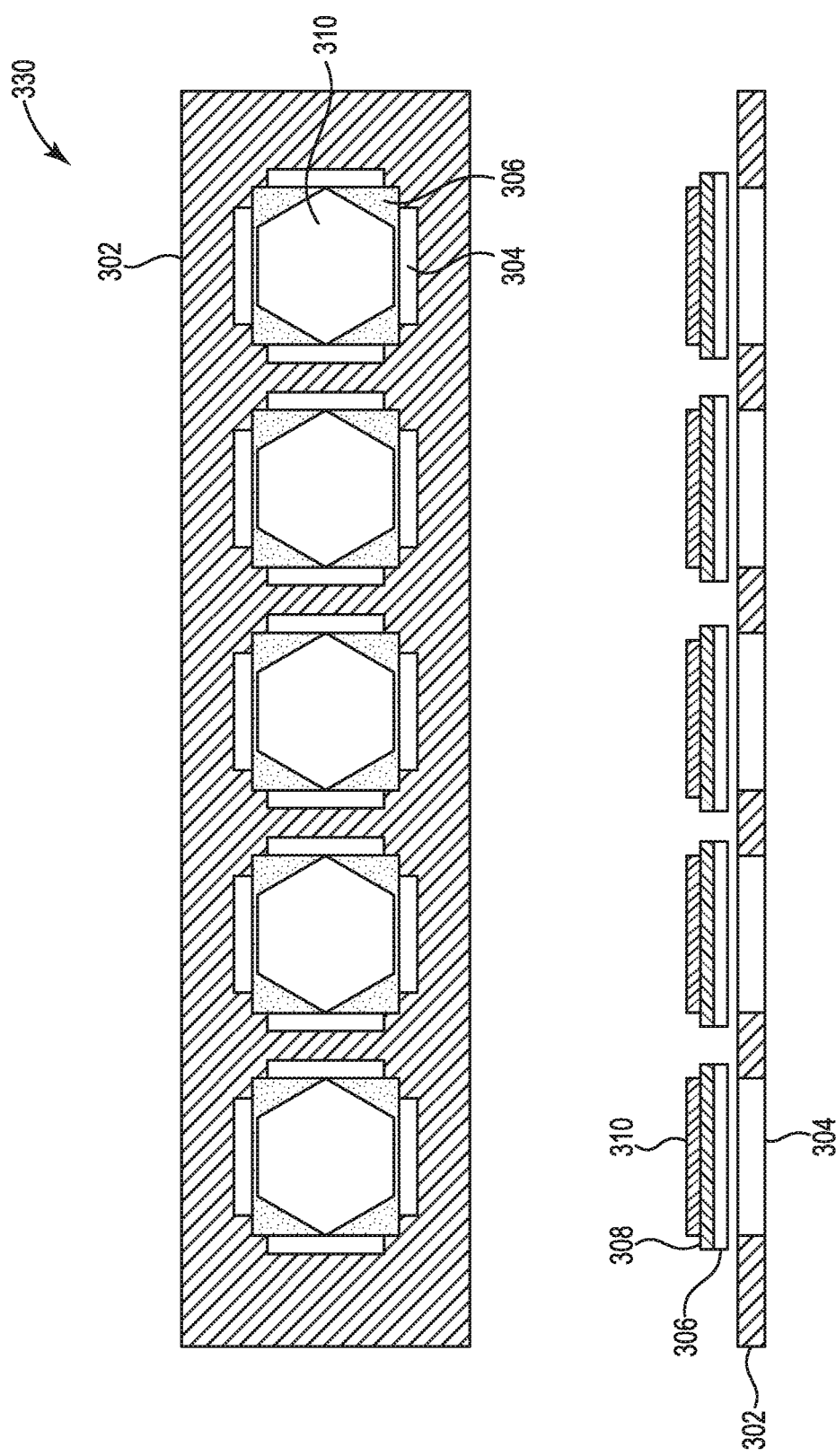

Step 106 may include dispensing a temporary adhesive onto the process substrate. FIG. 3B shows an example dispense of the temporary adhesive onto a process substrate. The temporary adhesive may be dispensed onto a side of the process substrate that includes the release layer such that the temporary adhesive is dispensed on the release layer. The temporary adhesive may be a polymer-based substance, such as an epoxy, and may be cured using EM radiation in some embodiments. In some embodiments, the temporary adhesive may be thermally cured. The temporary adhesive may provide a medium to temporarily affix a base die to the process substrate.

Figure 3C:
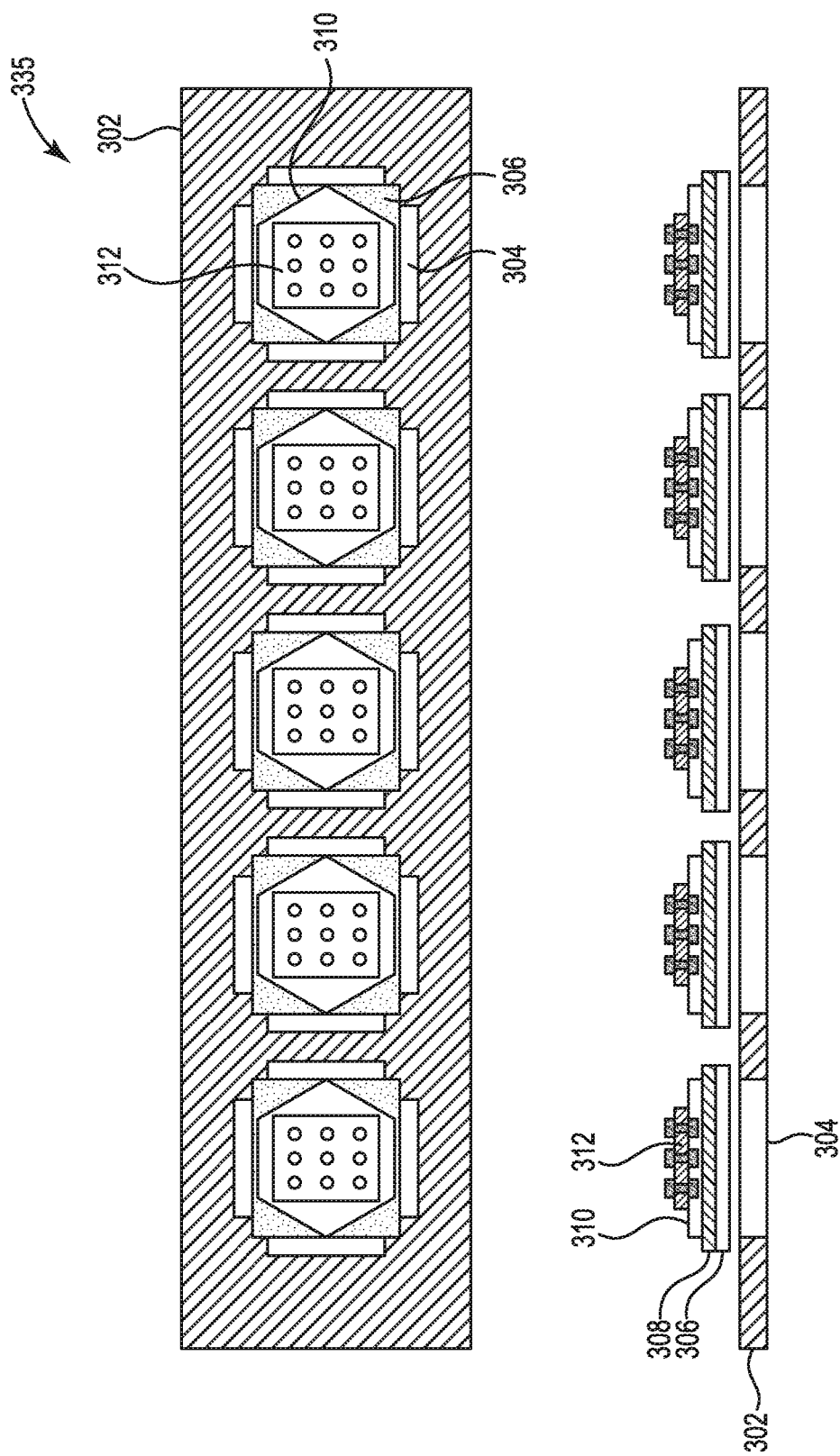

Step 108 may include placing a base die onto the temporary adhesive. FIG. 3C shows an example placement of a base die. The base die may be selected from an inventory of die. In some embodiments, the die in inventory may have already been tested so that only good die may be selected for placement in the step 108. The base die may be placed onto the temporary adhesive using any known placement technique, such as by a pick and place tool.

Figure 3D:
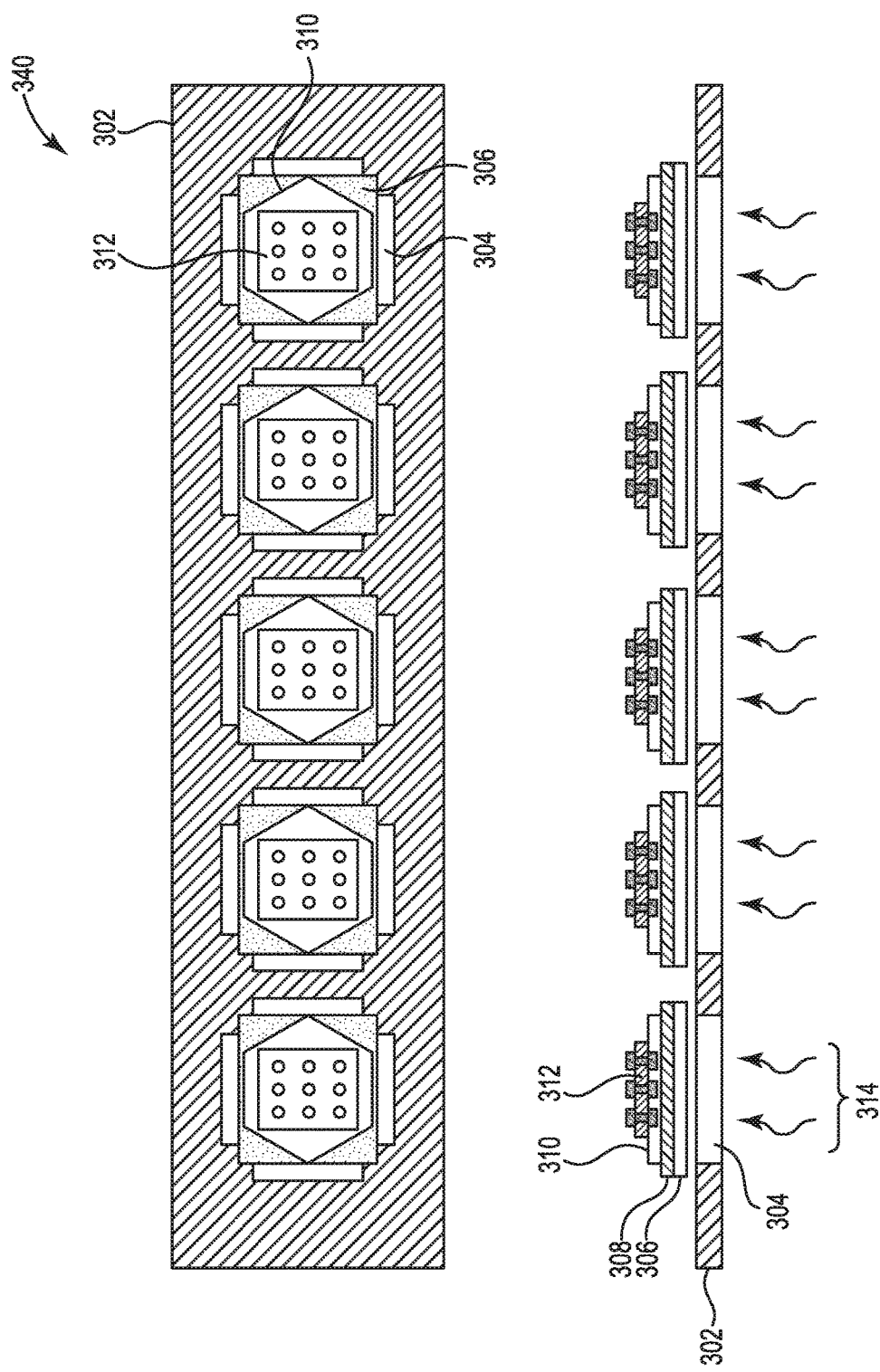

Step 110 may include curing the temporary adhesive. FIG. 3D shows an example cure of the temporary adhesive. The cure method may be determined by the specific temporary adhesive dispensed in the step 106, which may be either a thermal curing process or an EM radiation curing process. In some embodiments, the cure may be performed by exposing the temporary adhesive to ultraviolet (UV) radiation at a wavelength determined by the temporary adhesive. The exposure time may be dependent upon the temporary adhesive characteristics, the thickness of the temporary adhesive, and the intensity of the UV radiation. In some embodiments, the temporary adhesive may be exposed to the UV through the process substrate. The opening in the process carrier may provide access to the bottom side of the process substrate. Accordingly, it may be desirable that the material the process substrate is formed from at least be transparent to UV radiation at the selected wavelength.

In some embodiments, steps 108 and 110 may be performed substantially simultaneously. For example, the temporary adhesive may be cured immediately following placement of the base die onto the temporary adhesive. In such an embodiment, the steps 108 and 110 may be performed iteratively for each base die placed on a process substrate. For example, a first base die may be placed on a respective process substrate and the UV radiation cure may be performed nearly simultaneously with placement of the base die before the two steps are performed for a second base die. Performing the steps 108 and 110 in this manner may improve a process time of the process 100. Additionally, performing the steps 108 and 110 nearly simultaneously may prevent movement of the base die between placement of the base die onto the temporary adhesive and curing the temporary adhesive. In some embodiments, all of the base die for the process carrier may be placed onto the temporary adhesive of respective process substrates before curing the temporary adhesive of all process substrates in a batch cure process.

Figure 3E:
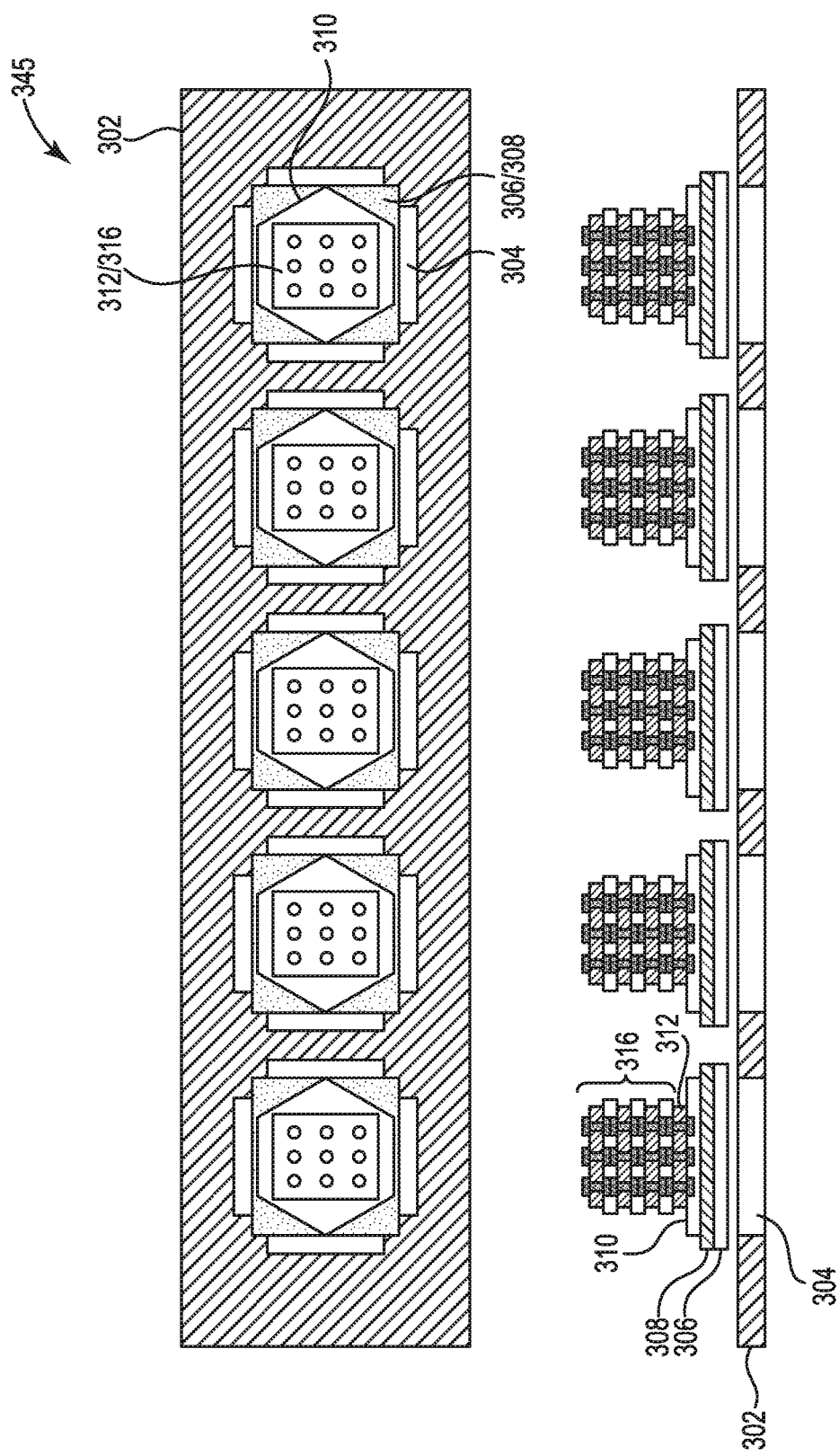

Step 112 may include placing one or more additional die onto the base die and processing the die (the base die and the one or more additional die) to form a die stack. FIG. 3E shows an example placement of a plurality of die onto a base die. The one or more additional die may be selected from an inventory of pre-tested, good die. In some embodiments, the one or more additional die may be selected from the same inventory from which the base die was selected. In some embodiments, the one or more additional die may be different types of die than the base die and from one another, such that each of the one or more additional die may be selected from different pre-tested inventories. Each additional die may be placed onto the stack one at a time and alignment may be performed using various techniques, such as alignment markers and/or infrared camera-assisted positioning. Each of the one or more additional die may be placed on top of a previously placed die using the discussed alignment techniques. The die may be stacked so that a bonding pad on one die is aligned with and in contact with a respective bonding pad or pillar on the adjacent die. The placement of the one or more additional die may result in the formation of stack of die, with the die stack including the base die.

The step 112 may further include processing the stack of die to form the die stack. Each die of the die stack, including the base die, may include bonding pads and/or bonding pillars on top and bottom sides of the die. The boding pads and bonding pillars may be formed from one or more metals. The one or more metals may form metallic bonds with a respective bond pillarbond pad upon performance of a heating process. Each die may also include through-via electrical connections that provide electrical connections between top and bottom sides of the die. The bonding pads, bonding pillars, and the through-via electrical connections may allow each die in the die stack to be electrically connected to the other die in the die stack. In some embodiments, each die in the die stack may be the same type of die, a memory die for example. In some embodiments, at least one of the die in the die stack may be different than the remaining die. For example, one of the die in the die stack may be a logic die, while each of the remaining die may be memory die. The type of die is a non-limiting aspect of the present disclosure.

Metallic bonds may be formed between adjacent die in the stack at the bonding pads/pillars that are placed in contact. The metallic bonds may result in the formation of electrical and/or mechanical bonds coupling adjacent die. For example, some of the bond pads and pillars included on the die may be electrically inactive and may provide structural support to the die stack, while other boding pads and pillars may be electrically active and provide electrical conduction paths between adjacent die. In some embodiments, thermocompression bonding may be used to form the bonds during the placement of each successive die of the die stack. In some embodiments, the one or more additional die of the die stack may be placed into position in the stack of die before a metal reflow process is performed to form the metallic bonds. As a result, a die stack formed of bonded die may result from the step 112.

Step 114 may include dispensing under fill material between each die of the die stack. The step 114 may be optional depending on the under fill material included in the process 100. For example, the step 114 may be included to dispense a non-conductive film that may flow into the spaces between the adjacent die in the die stack upon dispensing due to a capillary effect. For example, the non-conductive film may be a capillary under fill material, some embodiments, the under fill material may be a wafer level under fill film, which may be formed on the die at the wafer level, e.g., prior to wafer dicing. Accordingly, if a wafer level under fill film is included, then step 114 may be omitted since the under fill material would already have been formed on at least one side of each die of the die stack.

Step 116 may include activating the release layer release mechanism. FIG. 3F shows an example activation of the release layer release mechanism. The release mechanism may depend on the type of release layer included on the process substrate. For example, the release mechanism may include chemical breakdown of the release film. In some embodiments, the release mechanism may be initiated by exposing the release layer to a desired wavelength of EM radiation. For example, the release layer may be exposed to laser emission of a wavelength determined by the release layer through the opening of the process carrier and through the process substrate. The laser emission may cause the release layer to breakdown, e.g., degrade, so that the process substrate and the temporary adhesive may be separated. The laser emission may be in the UV, visible, or infrared range of the EM spectrum.

Step 118 may include removing the die stack from the process substrate. The die stack, including the temporary adhesive, may be removed from the process substrate using any known method, such as by pick and place. Removal of the process substrate may result in the die stack and temporary adhesive remaining attached but free from the process substrate. Step 120 may include moving the die stack and temporary adhesive to a carrier frame. FIG. 3G shows an example placement of a die stack and temporary adhesive moved to a carrier frame. In some embodiments, the steps 118 and 120 may be performed sequentially. For example, the sequential performance of the two steps may include removing the process substrate from the die stack by picking the die stack off of the process substrate, and then placing the die stack on a carrier film, which may be supported by a carrier frame. The die stack may be placed on the carrier film so that the temporary adhesive is positioned on an opposite side of the die stack from the carrier film. In some embodiments, the steps 116, 118, and 120 may be sequentially performed for each die stack. For example, the release layer mechanism may be initiated for a die stack/process substrate combination, the die stack including temporary adhesive picked off of the process substrate and then placed on a carrier film.

Step 122 may include removing the temporary adhesive. FIG. 3H shows an example of removing the temporary adhesive. The temporary adhesive may be removed using any known method. In some embodiments, the temporary adhesive may be removed using tape and a roller. For example, tape may be place in contact with the temporary adhesive. A roller may then be rolled over the tape while the tape is pulled up and away from the die stack as the roller rolls in the opposite direction. The temporary adhesive may remain attached to the tape as the tape is pulled up and away. As a result, the die stack may remain on the carrier film free of the temporary adhesive.

Figure 4:
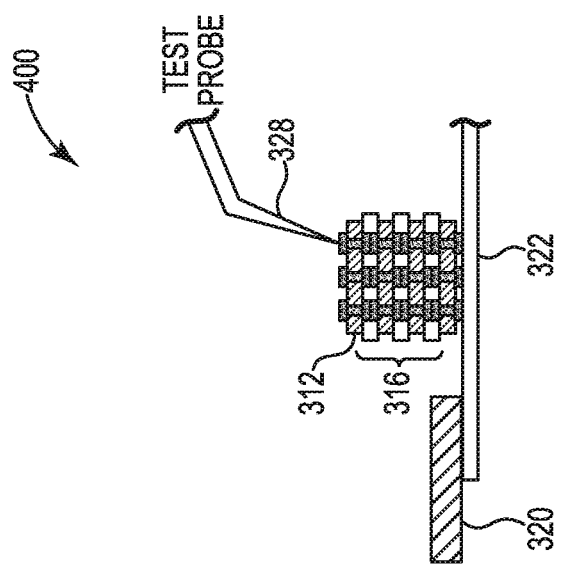
FIG. 4 is an illustration of a test process in accordance with an embodiment of the present disclosure.

124 may optionally include electrical testing the die stack. FIG. 4 shows an example of probe testing a die stack. The electrical testing may be dependent upon the types of die. Testing may be performed to ensure that the die stack performs as desired and as a way to select good die for additional process steps, such as a packaging process.

The process 100 may be performed to form die stacks, which may be subsequently be packaged. The process 100 may result in reduced processing costs due to processing only good die and further because fewer scrap may result. Additionally, handling risks may be reduced due to the process 100 being performed at the chip-level instead of the wafer-level.

FIG. 2 is an example diagram of a dicing pattern 200 to form one or more process substrates in accordance with an embodiment of the present disclosure. The dicing pattern 200 may include a plurality of lines 206 and a plurality of lines 204. The dicing pattern 200 may be used to define a number of process substrates of a desired shape and size. A substrate 202 may then be diced using the dicing pattern 200 as a guide to form one or more process substrates 208. The substrate 202 may be diced, e.g., cut, into one or more process substrates 208 based on the dicing pattern 200. The square grid defined by the plurality of lines 204 and 206 is a non-limiting aspect of the present disclosure and any shape and size of pattern falls within the scope of the present disclosure. In some embodiments, the process substrates 208 may be used as a temporary processing substrate for a die stacking process, such as the process 100.

The substrate 202, and by extension the one or more process substrates 208, may include a release layer (not shown in FIG. 2). The release layer may be formed on at least one side of the substrate 202. The release layer may include a release mechanism so that the process substrate 208 and an object mounted onto the release layer may be separated. For example, by activating the release mechanism, the substrate carrier 208 and an object mounted thereto may be separated. In some embodiments, the release mechanism may be activated using IM radiation of a desired wavelength. In some embodiments, the release layer may be exposed to radiation through the process substrate 208.

It may be desirable that the process substrate 208 and the release layer may be able to withstand multiple fabrication process steps, such as heating steps and chemical treatments, for example. Additionally, it may be desirable for the substrate 202 to be transparent to one or more wavelengths. For example, it may be desirable for the substrate 202 to be transparent to EM radiation of ultraviolet, visible, and infrared wavelengths.

FIG. 3A is an illustration of a process step 300 in accordance with an embodiment of the present disclosure. The process step 300 may be an example of the step 104 of the process 100. The process step 300 as shown depicts a process carrier 302 including one or more openings 304, and one or more process substrates 306. The one or more process substrates 306 may be placed over a respective opening 304. In an embodiment of the present disclosure, the process carrier 302 may be used as a carrier device for implementing the process 100.

The process carrier 302 may be formed to include the openings 304. The openings 304 may be formed to allow access to a bottom side of the process substrate 306. Each of the openings 304 may be configured to hold a process substrate 306, such as by tabs, bevels, clamps, etc. Other configurations to hold the carrier substrates 306 while allowing access from both a top and bottom side of the process substrate are within the scope of the present disclosure.

Each of the process substrates 306 may include a release layer 308, and may be placed over an opening 304 with the release layer 308 on a side opposite the process carrier 302. The process substrate 306 may be an example of the process substrate 208 of FIG. 2. Further, the process substrate 306 may be used as a temporary support substrate for one or more semiconductor die during a die stacking process, such the process 100.

FIG. 3B is an illustration of a process step 330 in accordance with an embodiment of the present disclosure. The process step 330 may be an example of the step 106 of the process 100. The process step 330 as shown depicts a temporary adhesive 310 dispensed onto a surface of the carrier substrate 306, such as on the release layer 308. The temporary adhesive 310 may be dispensed by a needle or jet dispense, for example. The hexagonal-shape of the temporary adhesive 310 depicted in FIG. 3B is for illustrative purposes, and is non-limiting. The temporary adhesive 310 may be used as temporary adhesive during a die stacking process, such as the process 100.

FIG. 3C is an illustration of a process step 335 in accordance with an embodiment of the present disclosure. The process step 335 may be an example of the step 108 of the process 100. The process step 335 as shown depicts the placement of a base die 312 onto the process substrate 306. The base die 312 may be placed onto the temporary adhesive 310. The temporary adhesive may provide a temporary holding layer for the base die 312 to ensure the base die 312 remains in place during subsequent processing steps of a die stacking process, the process 100 for example.

The base die may include electrical through-vias that may provide electrical connection from a top side to a bottom side of the base die 312. In some embodiments, the top side of the base die 312 may be placed in contact with the temporary adhesive 310, which may leave the bottom side of the base die 312 exposed, in some embodiments, the bottom side of the base die 312 may be placed in contact with the temporary adhesive 310. The bottom side of the base die 312 may have bonding pads and/or bonding pillars formed thereon. Bonding pads/pillars formed on the backside of the base die 312 may allow for placement and bonding of another die to the base die 312.

FIG. 3D is an illustration of a process step 340 in accordance with an embodiment of the present disclosure. The process step 340 may be an example of the step 110 of the process 100. The process step 340 as shown depicts curing the temporary adhesive 310. Curing the temporary adhesive 310 may result in the base die 312 being firmly held in place to the process substrate 306. In some embodiments, the curing of the temporary adhesive 310 may be performed by exposing the temporary adhesive 310 to radiation 314, which may be provided through the openings 304. In some embodiments, the radiation 314 may be ultraviolet (UV) radiation. The carrier substrate 306 and the release layer 308 may both be transparent to the radiation 314 so that the radiation 314 passes through to the temporary adhesive 310. The radiation 314 may be provided for a time based on the characteristics of the temporary adhesive 310.

In some embodiments, the entire bottom of the process carrier 302 may be exposed to the radiation 314, which may allow all openings to simultaneously receive the radiation 314, e.g., a batch cure process. For example, in embodiments using UV radiation, a UV source may be positioned underneath the process carrier 302 so that radiation 314 is simultaneously provided to each opening 304. In some embodiments, each opening 304 may individually be provided a radiation 314 exposure. For example, a UV source may be successively positioned under each opening 304 for a desired exposure time, and then moved to a subsequent opening 304. In some embodiments, the processes 335 and 340 may be performed iteratively. For example, the placement of the base die 312 and the exposure of the radiation 314 may be performed successively. For example, immediately after a base die 312 is placed onto a process substrate 306, the radiation 314 may be provided to cure the temporary adhesive 310 before the two steps are repeated at a next process substrate location.

FIG. 3E is an illustration of a process step 345 in accordance with an embodiment of the present disclosure. The process step 345 may be an example of the step 112 of the process 100. The process step 345 as shown depicts the placement of one or more die 316 onto the base die 312. For example, a first die of the one or more die 316 may be aligned with the base die using infrared camera alignment and/or alignment markers. Alignment and placement of the die may result in respective bonding pads and/or bonding pillars being aligned and placed into close proximity, e.g., contact. The alignment and placement steps may then be successively repeated for each die of a desired number of die.

The placement of the one or more die 316 may further include fabrication steps aimed at creating electrical and/or mechanical bonds between each of the one or more die 316 and the base die 312. For example, each of the one or more die 316 may be successively bonded to a previously bonded die using a thereto-compression bonding technique. In some embodiments, all of the die 316 may be placed as depicted in FIG. 3E before a metal reflow process is performed to form the electrical and/or mechanical bonds. The placement and bonding of the one or more die 316 onto the base die 312 may result in a die stack 312, 316, where the die stack may include both the base die 312 and the one or more additional die 316.

FIG. 3F is an illustration of a process step 350 in accordance with an embodiment of the present disclosure. The process step 350 may be an example of the step 116 of the process 100. The process step 350 as shown depicts activating the release mechanism of the release layer. In some embodiments, the release mechanism may be activated, e.g., initiated and/or caused, by exposing the release film 308 to a specific wavelength of EM radiation. For example, an exposure of radiation 318, which may be provided by a laser, may be provided to the release film 308 through an opening 304. The wavelength of the laser emission may be in the UV, visible, or infrared range of the EM spectrum. In some embodiments, the radiation 318 may be provided in a batch process so that all openings are provided the radiation 318 simultaneously. In some embodiments, each of the openings 304 may be individually provided the radiation 318. Releasing the release film 308 may allow the die stack 312, 316 and the temporary adhesive 310 to be removed from the process substrate 306.

FIG. 3G is an illustration of a process step 355 in accordance with an embodiment of the present disclosure. The process step 355 may be an example of the step 120 of the process 100. The process step 355 as shown depicts the placement of the die stack 312, 316 and the temporary adhesive 310 onto a carrier film 322 after removal from the process substrate 306. The carrier film 322 may be supported and/or attached to a carrier frame 320. The combination of the die stack 312, 316 and the temporary adhesive 310 may be placed on the carrier film 322 so that the temporary adhesive is positioned on an opposite side of the die stack from the carrier film 322. Positioning the temporary adhesive 310 as such may allow the subsequent removal of the temporary adhesive 310 leaving the die stack 312, 316.

FIG. 3H is an illustration of a process step 360 in accordance with an embodiment of the present disclosure. The process step 360 may be an example of the step 122 of the process 100. The process step 360 as shown depicts the removal of the temporary adhesive 310. The process 360 may include placing a tape 324 onto the exposed temporary adhesive 310. A roller 326 may subsequently be rolled along the temporary adhesive 310 while the tape 324 is lifted up and away as the roller 326 rolls over the die stacks 312, 316. As the tape 324 is pulled up, the temporary adhesive 310 is removed leaving the die stack 312, 316 on the carrier film 322.

FIG. 4 is an illustration of a test process 400 in accordance with an embodiment of the present disclosure. The test process 400 may be an example of the step 124 of the process 100. The test process 400 as shown depicts electrical testing a die stack, such as the die stack 312, 316 of FIG. 3. The removal of the temporary adhesive 310 may reveal electrical pads included on the base die 312, which may be used for electrical testing. A test probe 328 may be placed in contact with an exposed electrical pad in order to perform various electrical testing of the die stack 312, 316.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. A method comprising:
   placing a die onto a substrate including a release layer and a temporary adhesive;
   forming, on the substrate, a die stack that includes the die;
   removing the die and the temporary adhesive; and
   removing the temporary adhesive from the die.

2. The method of claim 1 wherein the die placed onto the substrate comprises a logic die and wherein the die stack comprises a plurality of memory die and the logic die.

3. The method of claim 1 wherein removing the base die and the temporary adhesive comprises activating the release layer.

4. The method of claim 1 wherein the substrate comprises a glass substrate.

5. The method of claim 1, further comprising:
   placing the die stack on a carrier film to remove the temporary adhesive from the die.

6. A method comprising:
   placing a process substrate over an opening of a process carrier, wherein the process substrate includes a release layer on one side, and wherein the side of the process substrate that includes the release layer is positioned opposite the opening of the process carrier;
   temporarily adhering a base die onto the release layer;
   stacking a plurality of die on the base die; and
   removing the process substrate from the base die.

7. The method of claim 6 wherein the opening of the process carrier provides access to a bottom side of the process substrate.

8. The method of claim 6 wherein the plurality of die stacked on the base die comprises a plurality of memory die.

9. The method of claim 6 wherein temporarily adhering the base die onto the release layer comprises adhering the base die to the release layer with a temporary adhesive that is removed separately from removing the process substrate from the base die.

10. The method of claim 6 wherein stacking the plurality of die on the base die comprises:
    aligning metallic bonding pads of a first die of the plurality of die with metallic bonding pads of a second die of the plurality of die; and
    forming metallic bonds between the metallic bonding pads of the first die of the plurality of die and the metallic bonding pads of the second die of the plurality of die.

11. The method of claim 10 wherein forming metallic bonds between the metallic bonding pads of the first die of the plurality of die and the metallic bonding pads of the second die of the plurality of die comprises performing a heating process.

12. A method, comprising:
    defining a shape and size of a process substrate on a substrate, wherein the substrate includes a release layer;
    dicing the substrate including the release layer based on the defined size and shape;
    dispensing a temporary adhesive onto the release layer of a process substrate to attach a die stack to the process substrate;
    activating the release layer disposed on the process substrate to remove the die stack; and
    removing the temporary adhesive from the die stack.

13. The method of claim 12 wherein the substrate on which the shape and size of the process substrate is defined comprises a substrate that is transparent to at least one wavelength of electro-magnetic radiation.

14. The method of claim 13 wherein activating the release layer comprises exposing the release layer to the at least one wavelength of electro-magnetic radiation.

15. The method of claim 12, further comprising placing the removed die stack onto a carrier film.

16. The method of claim 12 wherein removing the temporary adhesive from the die stack comprises:
    placing a tape in contact with the temporary adhesive; and
    rolling a roller over the tape while pulling the tape away from the die stack.

17. The method of claim 12 wherein the die stack comprises a logic die and a plurality of memory die stacked on the logic die.

18. A method comprising:
    forming a pattern on a substrate, wherein the substrate includes a release layer disposed on one side;
    dicing the substrate based on the pattern to form a temporary substrate;
    temporarily attaching a die onto the substrate,
    stacking a plurality of die onto the die attached to the substrate to form a die stack;
    removing the die stack from the substrate.

19. The method of claim 18 wherein temporarily attaching the die onto the substrate comprises:
    dispensing temporary adhesive onto the substrate;
    placing the die onto the temporary adhesive; and
    curing the temporary adhesive.

20. The method of claim 18, further comprising:
    placing the substrate onto a process carrier, wherein the process carrier has an opening and the substrate is placed over the opening.

* * * * *